(12) United States Patent
Takagi et al.

(10) Patent No.: US 10,962,309 B2
(45) Date of Patent: Mar. 30, 2021

(54) STACKED HEAT EXCHANGER

(71) Applicant: DENSO CORPORATION, Kariya (JP)

(72) Inventors: Yusuke Takagi, Kariya (JP); Ryohei Tomita, Kariya (JP); Shingo Oono, Kariya (JP)

(73) Assignee: DENSO CORPORATION, Kariya (JP)

( * ) Notice: Subject to any disclaimer, the term of this patent is extended or adjusted under 35 U.S.C. 154(b) by 34 days.

(21) Appl. No.: 16/407,863

(22) Filed: May 9, 2019

(65) Prior Publication Data
US 2019/0264984 A1 Aug. 29, 2019

Related U.S. Application Data

(63) Continuation of application No. PCT/JP2017/039800, filed on Nov. 2, 2017.

(30) Foreign Application Priority Data

Nov. 21, 2016 (JP) .............................. JP2016-226214
Aug. 2, 2017 (JP) .............................. JP2017-149810
Oct. 12, 2017 (JP) .............................. JP2017-198371

(51) Int. Cl.
*F28F 9/02* (2006.01)
*F28F 3/08* (2006.01)
(Continued)

(52) U.S. Cl.
CPC ............ *F28F 9/0248* (2013.01); *F28F 3/086* (2013.01); *H01L 23/46* (2013.01); *H05K 7/20009* (2013.01); *H05K 7/20272* (2013.01)

(58) Field of Classification Search
CPC ......... F28F 3/086; F28F 9/0248; H01L 23/46; H05K 7/20009; H05K 7/20272; F28D 9/0062; F28D 9/0043; F28D 9/005
See application file for complete search history.

(56) References Cited

U.S. PATENT DOCUMENTS 3,650,321 A * 3/1972 Kaltz .................... F28D 1/0333
165/104.33
4,274,482 A * 6/1981 Sonoda ................ B60H 1/3227
165/153

(Continued)

FOREIGN PATENT DOCUMENTS

DE          19805439 B4 *  6/2005  ............ F28F 9/0248
JP          2006005014 A    1/2006

*Primary Examiner* — Devon Russell
(74) *Attorney, Agent, or Firm* — Harness, Dickey & Pierce, P.L.C.

(57) ABSTRACT

A stacked heat exchanger includes: passage tubes stacked with each other to support a heat exchange object, a passage being defined in the passage tube for a heat medium to exchange heat with the heat exchange object; and a pipe connected to one of the passage tubes located at one end in a stacking direction of the plurality of passage tubes. Each of the passage tubes has a protruding pipe portion protruding in the stacking direction and communicating with the adjacent passage tube in the stacking direction. The one of the passage tubes located at the one end in the stacking direction is an in/out passage tube. The pipe has a surface at one end in a longitudinal direction of the pipe, and the surface intersects the longitudinal direction of the pipe and is joined to the in/out passage tube.

10 Claims, 7 Drawing Sheets

(51) Int. Cl.
   *H05K 7/20*   (2006.01)
   *H01L 23/46*  (2006.01)

(56) References Cited

U.S. PATENT DOCUMENTS

| | | | | |
|---|---|---|---|---|
| 5,918,667 | A * | 7/1999 | Chiba | F28F 9/182 |
| | | | | 165/173 |
| 5,992,510 | A * | 11/1999 | Kallrot | F28D 9/005 |
| | | | | 165/167 |
| 7,213,635 | B2 * | 5/2007 | Persson | F28F 9/026 |
| | | | | 165/78 |
| 8,363,403 | B2 * | 1/2013 | Tonomoto | H01L 23/473 |
| | | | | 361/699 |
| 8,678,077 | B2 * | 3/2014 | Shore | F28D 1/0325 |
| | | | | 165/153 |
| 2002/0038701 | A1 * | 4/2002 | Saito | F28F 9/027 |
| | | | | 165/153 |
| 2005/0023827 | A1 * | 2/2005 | Walterscheid | F16L 41/086 |
| | | | | 285/124.2 |
| 2005/0133210 | A1 * | 6/2005 | Inagaki | F28F 19/06 |
| | | | | 165/152 |
| 2007/0039717 | A1 * | 2/2007 | Inagaki | H01L 23/473 |
| | | | | 165/80.4 |
| 2009/0008061 | A1 | 1/2009 | Inagaki et al. | |
| 2011/0011568 | A1 * | 1/2011 | Han | F28D 9/0043 |
| | | | | 165/133 |

\* cited by examiner

STACKED HEAT EXCHANGER

CROSS REFERENCE TO RELATED APPLICATIONS

The present application is a continuation application of International Patent Application No. PCT/JP2017/039800 filed on Nov. 2, 2017, which designated the United States and claims the benefit of priority from Japanese Patent Application No. 2016-226214 filed on Nov. 21, 2016, Japanese Patent Application No. 2017-149810 filed on Aug. 2, 2017, and Japanese Patent Application No. 2017-198371 filed on Oct. 12, 2017. The entire disclosures of all of the above applications are incorporated herein by reference.

TECHNICAL FIELD

The present disclosure relates to a stacked heat exchanger.

BACKGROUND ART

Conventionally, various heat exchangers have been proposed in which passage tubes are disposed to support a heating element, such as a semiconductor module including a semiconductor element, from both sides to emit heat from the heating element.

SUMMARY

According to one aspect of the present disclosure, a stacked heat exchanger includes: a plurality of passage tubes stacked with each other to support a heat exchange object from both sides, a passage being defined in the passage tube for a heat medium to exchange heat with the heat exchange object; and a pipe connected to one of the plurality of passage tubes located at one end in a stacking direction of the plurality of passage tubes. Each of the plurality of passage tubes has a protruding pipe portion protruding in the stacking direction and communicating with the adjacent passage tube in the stacking direction. The one of the plurality of passage tubes located at the one end in the stacking direction is an in/out passage tube. The pipe has a surface at one end in a longitudinal direction of the pipe, and the surface intersects the longitudinal direction of the pipe and is joined to the in/out passage tube.

DETAILED DESCRIPTION

Figure 1:
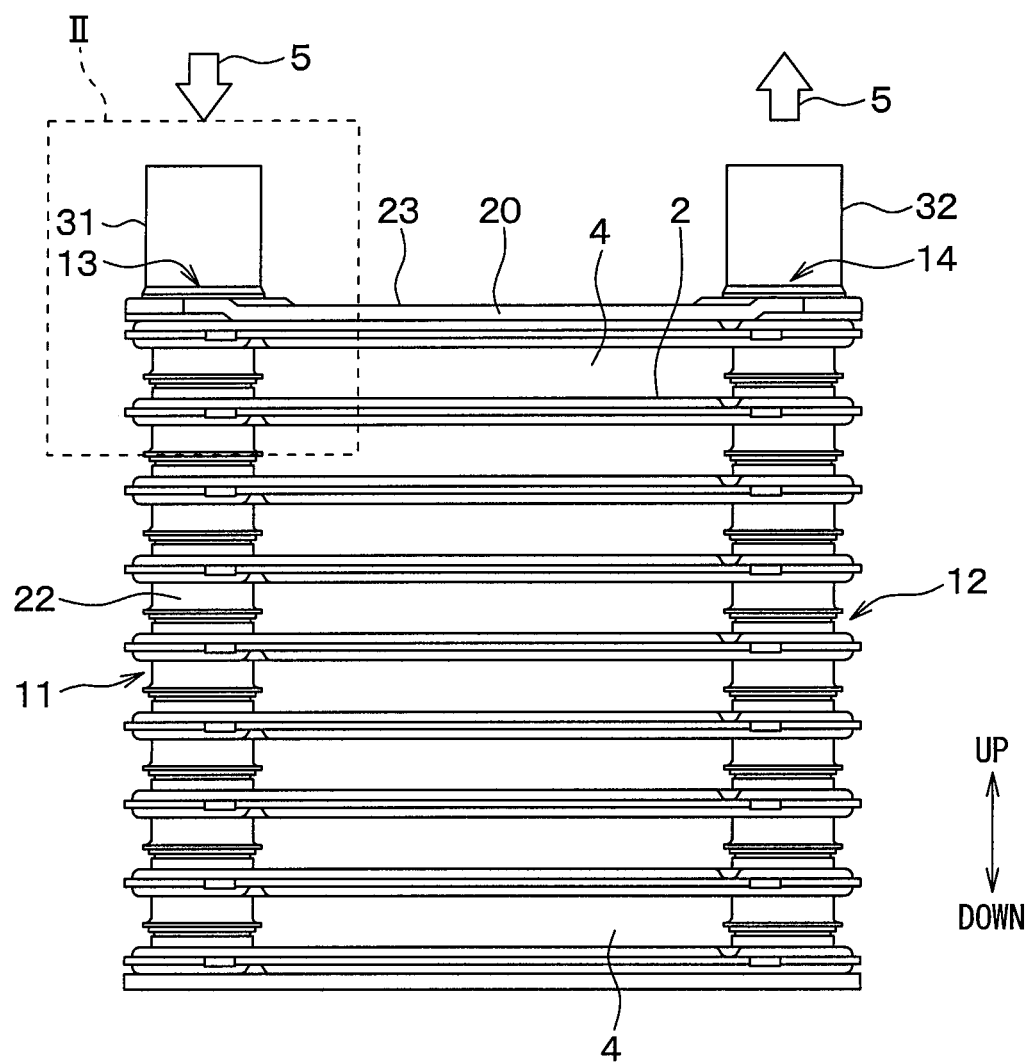
FIG. 1 is a front view illustrating a multilayer cooler according to a first embodiment.

To begin with, examples of relevant techniques will be described.

A multilayer cooler includes: plural cooling tubes stacked to support an electronic component from both sides; a supply header portion for supplying a cooling medium to the plural cooling tubes; and a discharge header portion for discharging the cooling medium from the plural cooling tubes. The cooler has a protruding pipe portion connecting the cooling tubes, and the cooling medium circulates between the cooling tubes through the protruding pipe portion.

In the cooler, one of the cooling tubes at one end in the stacking direction has two projecting openings for attaching a refrigerant introduction pipe for introducing refrigerant and a refrigerant discharge pipe for discharging refrigerant. The refrigerant introduction pipe and the refrigerant discharge pipe are attached by inserting into the respective projecting openings.

That is, in the cooler, the cooling tube at the intermediate area in the stacking direction of the cooling tubes (that is, passage tubes) has the protruding pipe portion connecting the cooling tubes adjacent to each other in the stacking direction. In contrast, the cooling tube at one end in the stacking direction has the projecting openings, instead of the protruding pipe portion, for attaching the refrigerant introduction pipe and the refrigerant discharging pipe. Therefore, according to the study of the inventors, the structure of the cooling tube at the one end in the stacking direction is different from the structure of the cooling tube at the intermediate area. As a result, the cost becomes high due to the variety of the components.

Further, in the cooler, when attaching the pipe to the introduction port or the discharge port provided in the cooling tube at the one end in the stacking direction, the pipe is inserted inside the introduction port and the discharge port. Thereafter, the tip end of the pipe is expanded so that the outer surface of the tip end of the pipe is brought into close contact with the inner surface of the introduction port and the inner surface of the discharge port.

As described above, since the pipe is attached according to the shapes of the introduction port and the discharge port, according to the study of the inventors, the assembling properties are low in the conventional cooler.

The present disclosure provides a stacked heat exchanger in which a pipe is attached to a passage tube without depending on the protruding pipe portion while reducing the number of components.

According to one aspect of the present disclosure, a stacked heat exchanger includes: a plurality of passage tubes stacked with each other to support a heat exchange object from both sides, a passage being defined in the passage tube for a heat medium to exchange heat with the heat exchange object; and a pipe connected to one of the plurality of passage tubes located at one end in a stacking direction of the plurality of passage tubes. Each of the plurality of passage tubes has a protruding pipe portion protruding in the stacking direction and communicating with the adjacent passage tube in the stacking direction. The one of the plurality of passage tubes located at the one end in the stacking direction is an in/out passage tube. The pipe has a surface at one end in a longitudinal direction of the pipe, and the surface intersects the longitudinal direction of the pipe and is joined to the in/out passage tube.

Accordingly, the surface of the pipe at the one end in the longitudinal direction of the pipe intersects the longitudinal direction of the pipe and is joined to the in/out passage tube. Therefore, it is possible to configure the in/out passage tube by using the same passage tube arranged at the intermediate area in the stacking direction, to reduce the number of components. Furthermore, it is possible to attach the pipe to the in/out passage tube regardless of the shape of the protruding pipe portion.

Hereinafter, embodiments will be described according to the drawings. Same or equivalent portions among respective embodiments below are labeled with same reference numerals in the drawings.

First Embodiment

Figure 2:
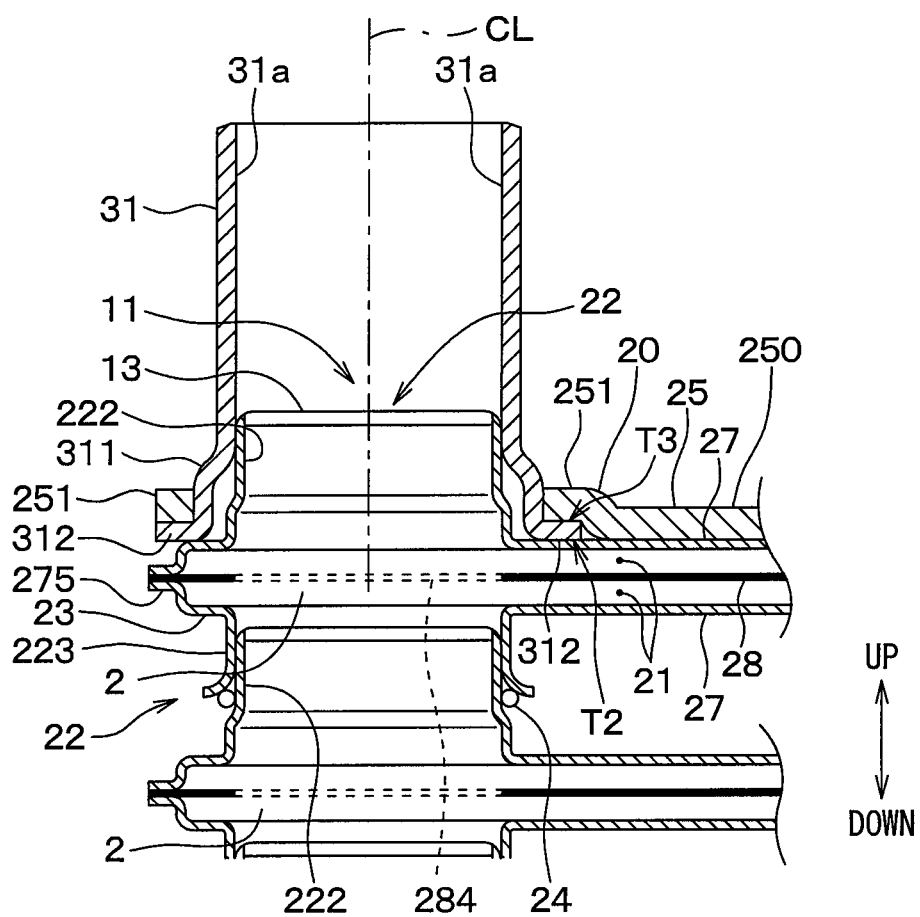
FIG. 2 is an enlarged view of a region II in FIG. 1.

A multilayer cooler according to a first embodiment will be described with reference to FIGS. 1 to 2. FIG. 1 is a front view illustrating the multilayer cooler according to the first embodiment. FIG. 2 is an enlarged view of a region II in FIG. 1. The arrows shown in the drawings indicate the up-down direction when the multilayer cooler is mounted on a vehicle.

As shown in FIG. 1, the multilayer cooler 1 of the present embodiment cools plural electronic components 4 from both sides thereof, and the electronic component 4 is formed in a plate shape housing a power element for controlling high power. The electronic component 4 is formed in a flat rectangular parallelepiped shape, from which a power electrode extends from a long side outer peripheral surface, and a control electrode extends from the other long side outer peripheral surface.

The cooling tube 2 is arranged to be in contact with a main plane of the electronic component 4, and another cooling tube 2 is arranged in contact with the other plane of the electronic component 4. The cooling tubes 2 are connected to a supply header portion 11 and a discharge header portion 12 provided at the both ends of the cooling tube 2. The cooling tube 2 corresponds to a passage tube. In the present embodiment, the plural electronic components 4 are cooled from both sides, since the electronic components 4 and the cooling tubes 2 are arranged alternately. The cooling tubes 2 are arranged at both ends in the stacking direction in an assembly in which the electronic components 4 and the cooling tubes 2 are stacked with each other.

The multilayer cooler 1 is formed by stacking the flat-shaped cooling tubes 2 in which a refrigerant passage 21 is defined for circulating a cooling medium 5 as a heat medium to support the electronic component 4 from both sides. The multilayer cooler 1 has the supply header portion 11 for supplying the cooling medium 5 to each of the refrigerant passages 21 and the discharge header portion 12 for discharging the cooling medium 5 from each of the refrigerant passages 21.

As shown in FIG. 1 and FIG. 2, the cooling tube 2 has a protruding pipe portion 22 which is opened and protruded in the stacking direction. An outer shell plate 27 forms the outer shell of the cooling tube 2, and has a portion defining a flat tube in contact with the electronic component 4 to emit heat and a portion defining the supply header portion 11 and the discharge header portion 12. The portion defining the supply header portion 11 and the discharge header portion 12 is formed at both end portions of the outer shell plate 27.

The portion of the outer shell plate 27 that defines the supply header portion 11 and the discharge header portion 12 includes the protruding pipe portion 22 protruding perpendicularly from the plate surface of the outer shell plate 27 and a diaphragm portion 23 annularly formed around the base part of the protruding pipe portion 22 with a predetermined width in the radial direction. The protruding pipe portion 22 connects the adjacent cooling tubes 2 with each other in the stacking direction to form the supply header portion 11 and the discharge header portion 12, and provides strength enough not to buckle with respect to the stacking direction.

The cooling tube 2 includes the flat tube portion, the diaphragm portion 23, and the protruding pipe portion 22 extending in the stacking direction. The protruding pipe portion 22 may be defined by a separate tubular member.

The protruding pipe portion 22 has a fitting structure for connection. That is, the protruding pipe portion 22 has a stepped large diameter pipe portion 223 arranged on the outer side and a small diameter pipe portion 222 inserted and arranged inside the large diameter pipe portion 223. Therefore, the multilayer cooler 1 includes at least two kinds of outer shell plates 27. One outer shell plate 27 has the large diameter pipe portion 223, and the other outer shell plate 27 has the small diameter pipe portion 222. The two kinds of outer shell plates 27 are alternately stacked on the front and back sides.

The multilayer cooler 1 includes another outer shell plate 27 for the end portions, at both ends. That is, the outer shell plate 27 disposed on the lower side of the lowermost cooling tube 2 in FIG. 1 does not have the protruding pipe portion 22.

The outer shell plate 27 disposed on the upper side of the uppermost cooling tube 2 in FIG. 1 includes the protruding pipe portions 22 having a refrigerant inlet 13 and a refrigerant outlet 14 respectively connected to a refrigerant introduction pipe 31 and a refrigerant discharge pipe 32.

The large diameter pipe portion 223 receives the small diameter pipe portion 222 therein. A stepped portion formed on the large diameter pipe portion 223 functions as a regulating portion for regulating the insertion length of the small diameter pipe portion 222. The distal end of the small diameter pipe portion 222 comes into contact with the stepped portion, and the inserted length in the axial direction is restricted. The regulating portion can be formed by an expanded portion or a bulging portion of the small diameter pipe portion 222 formed to protrude from the outer peripheral surface. There is a clearance between the inner surface of the large diameter pipe portion 223 and the outer surface of the small diameter pipe portion 222 for insertion in the assembling process, but the clearance is closed and tightly sealed by brazing by melting a ring brazing material 24.

The pair of outer shell plates 27 are joined with each other by brazing, in a state where the flange portions 275 of the outer shell plates 27 are disposed in parallel and in contact with each other. Therefore, the outer shell plates 27 are stacked and joined between flat surfaces perpendicular to the stacking direction by the flange portion 275, in the periphery portion of the outer shell plate 27. On the other hand, in the portion defining the supply header portion 11 and the discharge header portion 12, the outer shell plates 27 are stacked and joined between the cylindrical surfaces parallel to the stacking direction due to the fitting structure of the protruding pipe portions 22.

As described above, the adjacent cooling tubes 2 are connected with each other by fitting the protruding pipe portions 22, and the side walls of the protruding pipe portions 22 are joined to each other to communicate the refrigerant passages 21 with each other. Thereby, the supply header portion 11 and the discharge header portion 12 are formed.

The electronic component 4 is arranged between the adjacent cooling tubes 2, and is in close contact with each of the cooling tubes 2. As shown in FIG. 1, in the present embodiment, eight electronic components 4 are held between nine cooling tubes 2 that are stacked with each other.

As shown in FIG. 2, the cooling tube 2 includes the pair of outer shell plates 27, an intermediate plate 28 disposed between the pair of outer shell plates 27, and a corrugated inner fin (not shown) disposed between the intermediate plate 28 and the outer shell plate 27.

The refrigerant passage 21 is formed between the intermediate plate 28 and the outer shell plate 27.

The outer shell plate 27, the intermediate plate 28, and the inner fin (not shown) are brazed to each other to form the cooling tube 2.

The intermediate plate 28 has a rectangular plate shape. The intermediate plate 28 has a circular opening 284 corresponding to the supply header portion 11 and the discharge header portion 12 at both end portions thereof. The outer periphery of the intermediate plate 28 may be supported between the outer shell plates 27.

In the present embodiment, the cooling tube 2 disposed at the uppermost end in FIG. 1 is referred to as an in/out cooling tube 20. The in/out cooling tube 20 corresponds to an in/out passage tube. The in/out cooling tube 20 has the same shape as that of the cooling tube 2 in the intermediate area in the stacking direction of the cooling tubes 2. A reinforcing plate 25 is further provided on a surface of the in/out cooling tube 20 in which the refrigerant inlet 13 and the refrigerant outlet 14 are formed.

The protruding pipe portion 22 of the in/out cooling tube 20 defines the refrigerant inlet 13 and the refrigerant outlet 14. The refrigerant introduction pipe 31 is connected to the refrigerant inlet 13, and the refrigerant discharge pipe 32 is connected to the discharge header portion 12.

The configuration of the joining portion between the in/out cooling tube 20 and the refrigerant introduction pipe 31 will be described. The refrigerant introduction pipe 31 is made of metal such as aluminum in which a brazing material is clad on the entire inner peripheral surface. As shown in FIG. 2, the refrigerant introduction pipe 31 has an expanded portion 311 and a pipe seat surface 312.

The diameter of the expanded portion 311 is increased as approaching the end of the refrigerant introduction pipe 31 so as to cover the large diameter pipe portion 223 of the protruding pipe portion 22. The inner surface of the refrigerant introduction pipe 31 is in contact with the outer surface of the large diameter pipe portion 223.

The pipe seat surface 312 is formed at the tip end of the refrigerant introduction pipe 31 and abuts against the plate surface of the outer shell plate 27 of the in/out cooling tube 20. The pipe seat surface 312 is substantially perpendicular to the center line CL of the refrigerant introduction pipe 31. The pipe seat surface 312 has an L-shape in the cross section.

That is, when the pipe seat surface 312 abuts against the plate surface of the outer shell plate 27 of the in/out cooling tube 20, the center line CL of the refrigerant introduction pipe 31 is substantially perpendicular to the plate surface of the outer shell plate 27 of the in/out cooling tube 20. The pipe seat surface 312 is formed by bending one end portion of the refrigerant introduction pipe 31 in the longitudinal direction by approximately 90 degrees outward in the radial direction of the refrigerant introduction pipe 31.

The refrigerant introduction pipe 31 has the expanded portion 311 and the pipe seat surface 312 formed at the end of the pipe 31, to cover the protruding pipe portion 22 provided on the in/out cooling tube 20, and is fixed to the plate surface of the outer shell plate 27 of the in/out cooling tube 20 by brazing.

The refrigerant introduction pipe 31 and the in/out cooling tube 20 are joined by brazing at the contact portion T2 between the pipe seat surface 312 and the plate surface of the outer shell plate 27 of the in/out cooling tube 20, and the clearance is closed by the tight sealing.

Since the outer shell plates 27 of the cooling tube 2 and the in/out cooling tube 20 are made of thin metal, the strength is low. However, it is necessary to increase the strength of the in/out cooling tube 20 arranged at the end, in order to secure resistance to impact, among the plural cooling tubes 2.

Since the in/out cooling tube 20 of the present embodiment is made of the same outer shell plate 27 as the intermediate passage tube, the strength of the in/out cooling tube 20 is increased by the reinforcing plate 25.

The reinforcing plate 25 has the function of increasing the strength of the outer shell plate 27 of the in/out cooling tube 20 and increasing the fixing strength of the refrigerant introduction pipe 31 and the refrigerant discharge pipe 32. The reinforcing plate 25 is formed of a plate member having a thickness larger than that of the outer shell plate 27 of the in/out cooling tube 20. The reinforcing plate 25 is made of metal having high thermal conductivity such as aluminum or copper. A brazing material is clad on the surface of the reinforcing plate 25 in contact with the outer shell plate 27. The reinforcing plate 25 of the present embodiment is provided to cover the entire outer shell plate 27 of the in/out cooling tube 20.

The reinforcing plate 25 is fixed to press the pipe seat surface 312 of the refrigerant introduction pipe 31 against the outer shell plate 27, around the periphery of the expanded portion 311 of the refrigerant introduction pipe 31. Then, the reinforcing plate 25 is fixed to the outer shell plate 27 of the in/out cooling tube 20 by brazing.

Thereby, the reinforcing plate 25 and the pipe seat surface 312 are fixed by brazing at the contact portion T3 between the reinforcing plate 25 and the pipe seat surface 312.

Similarly to the refrigerant introduction pipe 31, the refrigerant discharge pipe 32 is assembled to the plate surface of the outer shell plate 27 of the in/out cooling tube 20. The brazing described above is carried out all together in a state where the components are assembled.

According to the above configuration, the stacked heat exchanger includes the cooling tubes 2 stacked with each other to support the electronic component 4 from both sides. A passage through which the cooling medium 5 flows is defined in the cooling tube 2 to exchange heat with the electronic component 4. The stacked heat exchanger includes the pipe 31, 32 connected to the in/out cooling tube 20 at one end in the stacking direction of the cooling tubes 2. Each of the cooling tubes 2 and the in/out cooling tube 20 has the protruding pipe portion 22 protruding in the stacking direction of the cooling tubes 2 and communicating with the adjacent cooling tube 2 in the stacking direction of the cooling tubes 2. The cooling tube 2 at the one end in the stacking direction of the cooling tubes 2 is the in/out cooling tube 20. The pipe 31, 32 has a surface which intersects with the longitudinal direction of the pipe at the end of the pipe 31, 32, and the surface is joined to the in/out cooling tube 2.

According to such a configuration, the pipe 31, 32 has the surface intersecting with the longitudinal direction of the pipe at the end of the pipe 31, 32, and the surface intersecting with the longitudinal direction of the pipe is joined to the in/out cooling tube 2. Therefore, it is possible to configure the in/out cooling tube 20 by the same as the cooling tubes 2 arranged in the intermediate area in the stacking direction, and it is possible to reduce the number of component. Furthermore, it is possible to attach the pipe to the in/out passage tube regardless of the shape of the protruding pipe portion.

In a cooler of a comparison example, when attaching a pipe to the cooling tube at the end in the stacking direction, each pipe is inserted inside the fluid inlet and the fluid outlet, and then the tip end of each pipe is expanded. Then, the outer surface of the tip end of each pipe and the inner surface of the fluid inlet are brought into close contact with each other, and the outer surface of the tip end of the pipe and the inner surface of the fluid outlet are brought into close contact with each other. In such a pipe attaching method, when expanding the distal end of each pipe, each pipe is easily inclined with respect to the plate surface of the cooling tube. That is, the assembling property is low.

In contrast, in the multilayer heat exchanger of this embodiment, the end portion of the pipe 31, 32 is joined to the in/out cooling tube 20 without expanding the tip end. That is, since the surface intersecting with the longitudinal direction of the pipe is joined to the in/out cooling tube 20, it is possible to improve the assembling accuracy by reducing the inclination at the time of assembling the pipe. Further, in the multilayer heat exchanger of this embodiment, the pipe seat surface 312 is formed at one end in the longitudinal direction of the pipe 31, 32, and has an L-shaped cross section defining the surface intersecting with the longitudinal direction of the pipe 31, 32. Therefore, the pipe 31, 32 can be more stably fixed to the in/out cooling tube 20 due to the pipe seat surface 312. That is, it is possible to fix the pipe 31, 32 to the in/out cooling tube 20 more accurately by reducing the inclination.

Further, since the pipe seat surface 312 is joined to the surface of the in/out cooling tube 20 by brazing, the air-tightness between the pipe seat surface 312 and the surface of the in/out cooling tube 20 can be secured.

In addition, the reinforcing plate is provided for pressing the pipe seat surface 312 against the surface of the in/out cooling tube 20. Accordingly, the strength of the in/out cooling tube 20 can be increased, and the fixing strength of the refrigerant introduction pipe 31 and the refrigerant discharge pipe 32 can be increased.

Second Embodiment

Figure 3:
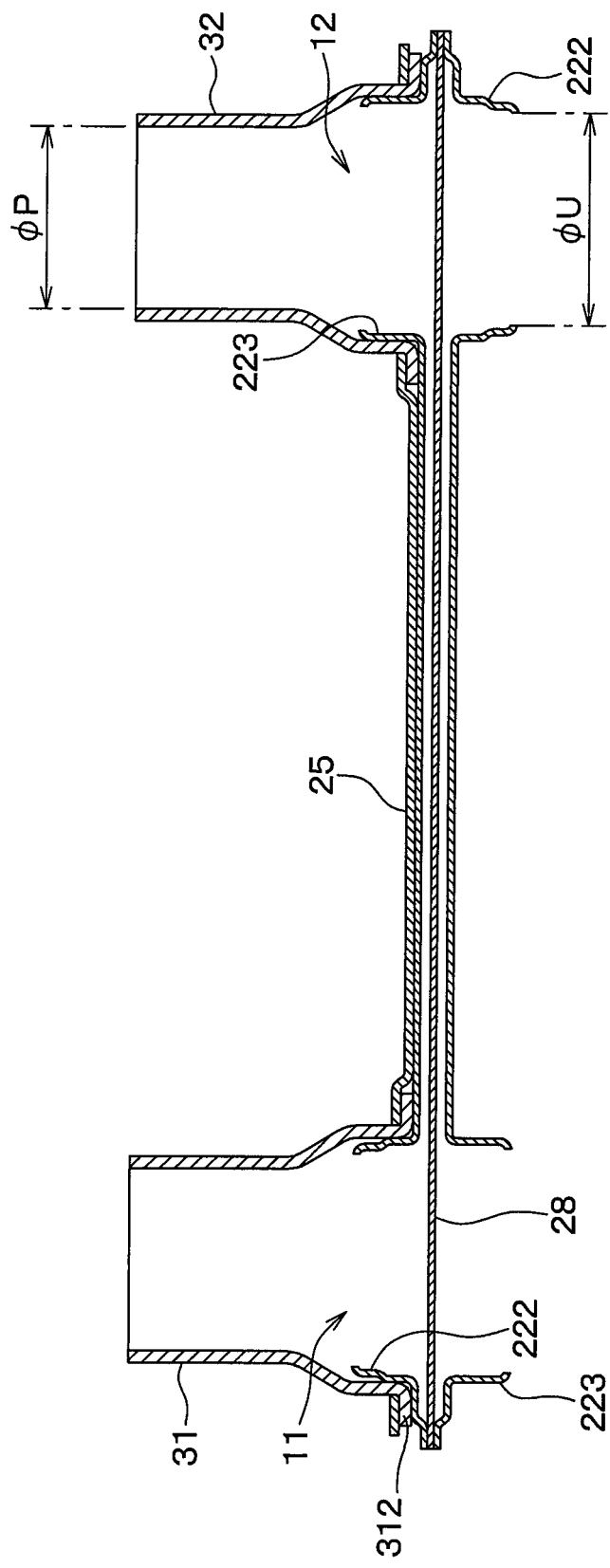
FIG. 3 is a partial cross-sectional view illustrating an in/out passage tube of a multilayer cooler according to a second embodiment.

A multilayer cooler according to a second embodiment will be described with reference to FIG. 3. In the first embodiment, the end portion of the refrigerant introduction pipe 31 is fixed to the in/out cooling tube 20 to cover the periphery of the small diameter pipe portion 222 of the protruding pipe portion 22. In the second embodiment, the end portion of the refrigerant discharge pipe 32 is joined to the in/out cooling tube 20 so as to cover the periphery of the large diameter pipe portion 223 of the protruding pipe portion 22.

In the present embodiment, the pipe has a first pipe corresponding to the refrigerant introduction pipe 31 and a second pipe corresponding to the refrigerant discharge pipe 32. Further, the protruding pipe portion 22 has the large diameter pipe portion 223 and the small diameter pipe portion 222 inserted and arranged inside the large diameter pipe portion 223. The in/out cooling tube 20 has the large diameter pipe portion 223 and the small diameter pipe portion 222 on the respective surfaces opposite to each other in the stacking direction of the passage tubes 2.

The first pipe 31 is arranged such that one end portion of the first pipe 31 in the longitudinal direction covers the outer side of the small diameter pipe portion 222. The second pipe 32 is disposed such that one end portion of the second pipe 32 in the longitudinal direction covers the outer side of the large diameter pipe portion 223.

As described above, the large diameter pipe portion 223 and the small diameter pipe portion 222 with different diameters are provided on the surface of the in/out cooling tube 20 adjacent to the adjacent cooling tube 2 in the stacking direction of the cooling tubes 2. Even with such a configuration, the first pipe 31 is disposed such that one end portion of the first pipe 31 in the longitudinal direction covers the outer side of the small diameter pipe portion 222, and the second pipe 32 is disposed such that one end portion of the second pipe 32 in the longitudinal direction covers the outer side of the large diameter pipe portion 223. Therefore, it is possible to attach the pipes 31, 32 to the in/out passage tube regardless of the shape of the protruding pipe portion 22. That is, it is possible to attach the pipes 31, 32 having the same diameter to the in/out passage tube. Further, it is also possible to configure the in/out cooling tube 20 and the intermediate cooling tubes 2 as the same type of cooling tube.

In the multilayer cooler of the present embodiment, the inner diameter $\phi P$ of the first pipe 31 and the second pipe 32 is smaller than or equal to the inner diameter $\phi U$ of the small diameter pipe portion 222 of the protruding pipe portion 22.

For example, when the inner diameter $\phi U$ of the small diameter pipe portion 222 is larger than the inner diameter $\phi P$ of the first pipe 31 and the second pipe 32, the pressure loss of the cooling medium 5 flowing through the protruding pipe portion 22 increases. In this case, the flow rate of the cooling medium 5 flowing into the cooling tube 2 decreases as separating from the cooling tube 2 connected to the first pipe 31 and the second pipe 32. Instead, the flow rate of the cooling medium 5 flowing through the cooling tube 2 in or near the cooling tube 2 connected to the first pipe 31 and the second pipe 32 is increased. Therefore, the balance in flow rate of the cooling medium 5 flowing through the respective cooling tubes 2 deteriorates.

However, in the multilayer cooler of the present embodiment, the inner diameter $\phi P$ of the first pipe 31 and the second pipe 32 is equal to or smaller than the inner diameter $\phi U$ of the small diameter pipe portion 222 of the protruding pipe portion 22. That is, the inner diameter $\phi U$ of the small diameter pipe portion 222 is larger than the inner diameter $\phi P$ of the first pipe 31 and the second pipe 32. Therefore, the pressure loss of the cooling medium 5 flowing through the protruding pipe portion 22 does not increase, and the flow rate of the cooling medium 5 flowing through each cooling tube 2 can be made uniform.

The cooling tube 2 connected to the first pipe 31 and the second pipe 32 of the present embodiment has the large diameter pipe portion 223 and the small diameter pipe portion 222. One end of the first pipe 31 in the longitudinal direction is placed to cover the outer side of the small diameter pipe portion 222, and one end of the second pipe 32 in the longitudinal direction is disposed to cover the outer side of the large diameter pipe portion 223.

Alternatively, the cooling tube 2 connected to the first pipe 31 and the second pipe 32 may have two large diameter pipe portions 223. In this case, the first pipe 31 is arranged such that one end portion of the first pipe 31 in the longitudinal direction covers the outer side of one large diameter pipe portion 223, and the second pipe 32 is arranged such that one end portion of the second pipe 32 in the longitudinal direction covers the outer side of the other large diameter pipe portion 223.

Further, the cooling tube 2 connected to the first pipe 31 and the second pipe 32 may have two small diameter pipe portions 222. In this case, the first pipe 31 is arranged such that one end portion of the first pipe 31 in the longitudinal direction covers the outer side of one small diameter pipe portion 222, and the second pipe 32 is arranged such that one end portion of the second pipe 32 in the longitudinal direction covers the outer side of the other small diameter pipe portion 222.

The present embodiment can achieve the effects and advantages, which are obtained from the structure common to the first embodiment.

Third Embodiment

Figure 4:
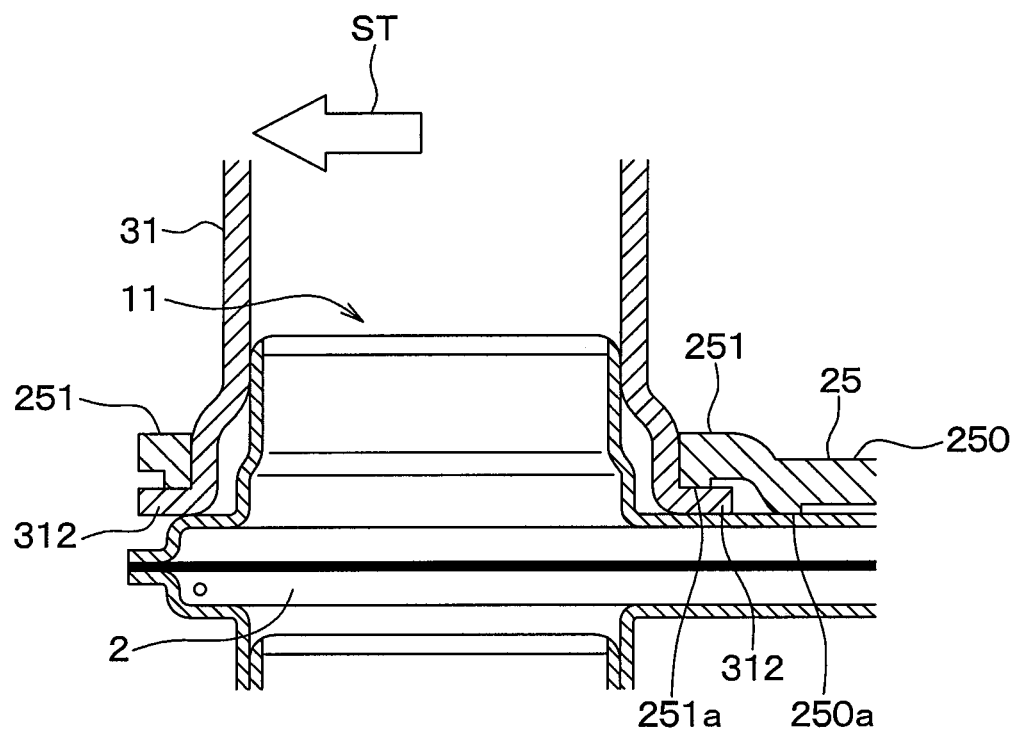
FIG. 4 is a partial enlarged view illustrating a multilayer cooler according to a third embodiment.

A multilayer cooler according to a third embodiment will be described with reference to FIGS. 4 to 6. In the first embodiment, the fixing strength of the refrigerant introduction pipe 31 and the refrigerant discharge pipe 32 is increased by the reinforcing plate 25. In the third embodiment, in order to further enhance the strength of the refrigerant introduction pipe 31 and the refrigerant discharge pipe 32, the reinforcing plate 25 has a passage tube stepped portion 250a and a seat surface stepped portion 251a.

The seat surface stepped portion 251a is configured as a part of a surface of the reinforcing plate 25 that faces the pipe seat surface 312. As shown in FIG. 5, the seat surface stepped portion 251a is formed in an annular shape along the circumferential direction of the pipe seat surface 312. The seat surface stepped portion 251a partially protrudes toward the pipe seat surface 312 on the surface of the reinforcing plate 25 that faces the pipe seat surface 312.

The passage tube stepped portion 250a is formed on the reinforcing plate 25 on the outer circumferential side of the seat surface stepped portion 251a in the radial direction of the refrigerant introduction pipe 31. The passage tube stepped portion 250a is formed in an arc shape along the circumferential direction of the pipe seat surface 312. The passage tube stepped portion 250a partially protrudes toward the in/out cooling tube 20 on the surface of the reinforcing plate 25 facing the surface of the in/out cooling tube 20.

When bringing the reinforcing plate 25 into contact with the surface of the in/out cooling tube 20, first, the seat surface stepped portion 251a and the passage tube stepped portion 250a come into contact with the surface of the in/out cooling tube 20.

The brazing material is clad on the whole surface of the reinforcing plate 25. Fillets are formed preferentially on the seat surface stepped portion 251a and the passage tube stepped portion 250a when start heating. In other words, the molten brazing material is preferentially gathered to the seat surface stepped portion 251a and the passage tube stepped portion 250a due to surface tension. Then, the reinforcing plate 25 and the passage tube are strongly joined by the seat surface stepped portion 251a and the passage tube stepped portion 250a.

Figure 5:
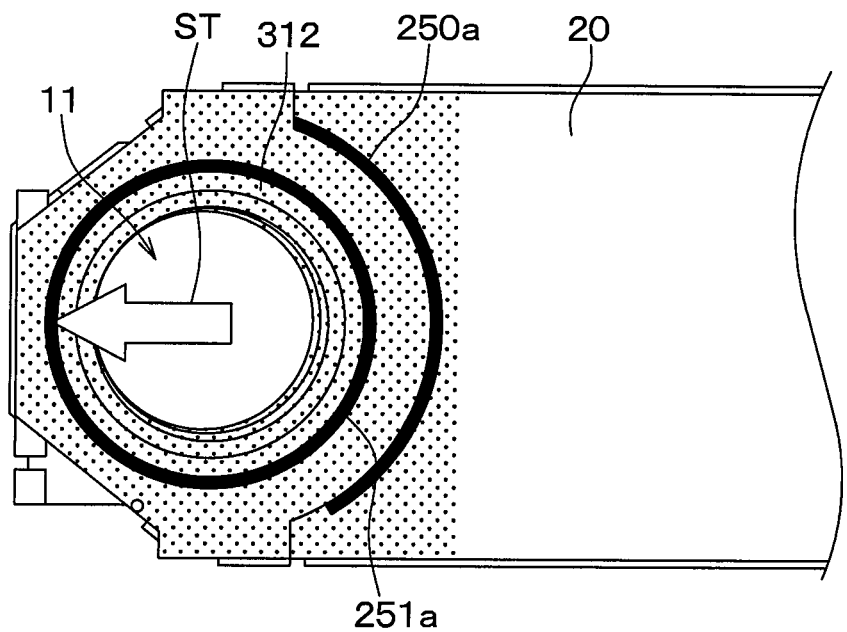
FIG. 5 is a view illustrating a positional relationship between an in/out passage tube, a seat surface stepped portion, and a passage tube stepped portion.

Even when a bending stress is applied to the refrigerant introduction pipe 31 in the arrow direction ST in FIG. 5, the seat surface stepped portion 251a and the passage tube stepped portion 250a have sufficient adhesion property. Therefore, the whole member of the reinforcing plate 25 including the periphery of the pipe can receive the stress, and the fixing strength of the refrigerant introduction pipe 31 is secured.

Figure 6:
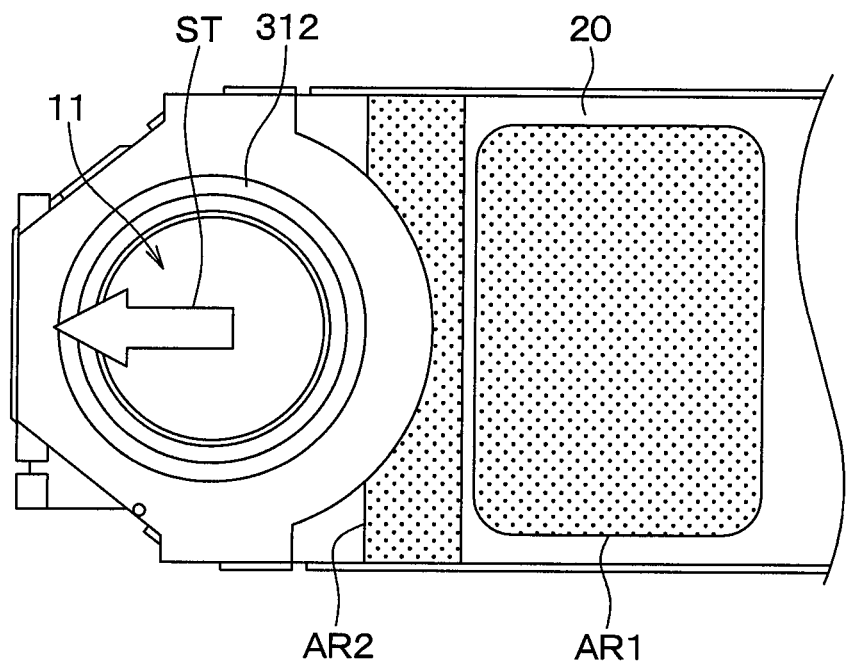
FIG. 6 is a view for explaining a comparative example in which a seat surface stepped portion and a passage tube stepped portion are not provided.

In FIG. 6, the seat surface stepped portion 251a and the passage tube stepped portion 250a are not formed, and the joining is achieved only in the region AR1. In some cases, a bending stress in the arrow direction ST in FIG. 5 may be applied to the refrigerant introduction pipe 31. The bending stress is concentrated on the region AR2 because the stress cannot be transmitted to a portion of the reinforcing plate 25 around the pipe. In this case, it will be difficult to maintain the fixing strength of the refrigerant introduction pipe 31.

The present embodiment can achieve the effects and advantages, which are obtained from the structure common to the first embodiment.

Fourth Embodiment

Figure 7:
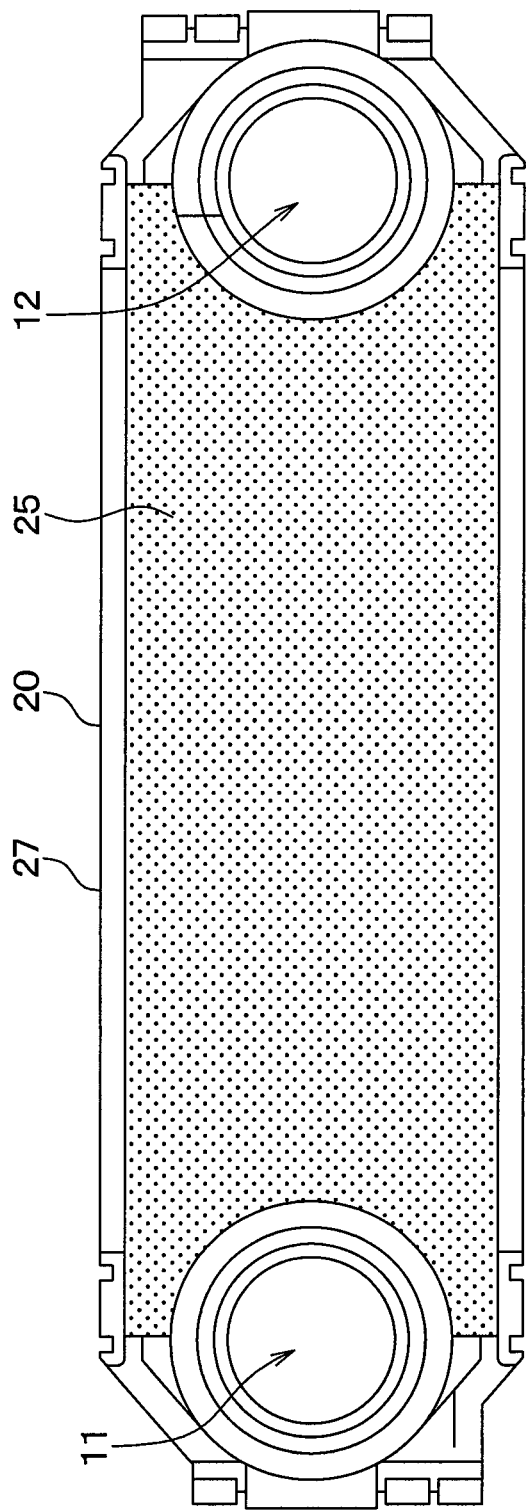
FIG. 7 is a view illustrating a shape of a reinforcing plate of a multilayer cooler according to a fourth embodiment.

A multilayer cooler according to a fourth embodiment will be described with reference to FIG. 7. In the first embodiment, the reinforcing plate 25 is provided so as to cover the entire outer shell plate 27 of the in/out cooling tube 20. In the fourth embodiment, the reinforcing plate 25 is provided so as to cover the central portion of the outer shell plate 27 of the in/out cooling tube 20. In FIG. 7, the reinforcing plate 25 is indicated by dot-hatching.

The reinforcing plate 25 is formed so as to cover the semicircular part of the small diameter pipe portion 222 defining the supply header portion 11 and the semicircular part of the large diameter pipe portion 223 defining the discharge header portion 12. In this way, the reinforcing plate 25 may be provided so as to cover a part of the outer shell plate 27 of the in/out cooling tube 20.

The present embodiment can achieve the effects and advantages, which are obtained from the structure common to the first embodiment.

Fifth Embodiment

Figure 8:
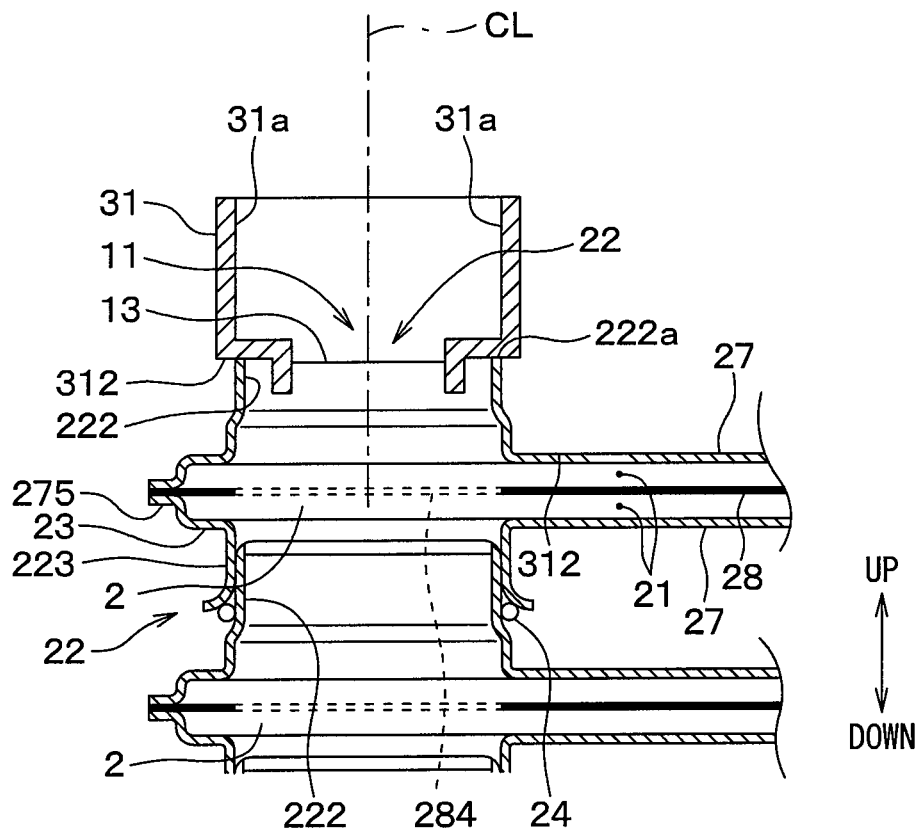
FIG. 8 is a partial cross-sectional view illustrating an in/out passage tube of a multilayer cooler according to a fifth embodiment.

A multilayer cooler according to a fifth embodiment will be described with reference to FIG. 8. In the first embodiment, the pipe seat surface 312 bent outward in the radial direction of the refrigerant introduction pipe 31 is formed at one end of the refrigerant introduction pipe 31 in the longitudinal direction, and the pipe seat surface 312 which intersects the longitudinal direction of the pipe is joined to the in/out passage tube 20. In this embodiment, the pipe seat surface 312 is bent inward in the radial direction of the refrigerant introduction pipe 31 at one end of the refrigerant introduction pipe 31 in the longitudinal direction. A surface of the pipe seat surface 312 that intersects the longitudinal direction of the pipe is joined to the open end 222a of the small diameter pipe portion 222 of the protruding pipe portion 22.

In the present embodiment, the surface formed by the pipe seat surface 312 intersecting with the longitudinal direction of the pipe is joined by brazing to the open end 222a of the small diameter pipe portion 222 of the protruding pipe portion 22.

According to such a configuration, the refrigerant introduction pipe 31 can be attached to the protruding pipe portion 22 irrespective of the length of the protruding pipe portion 22 and the shape of the side surface of the protruding pipe portion 22. Further, the refrigerant introduction pipe 31 can be attached to the protruding pipe portion 22 without expanding the tip end of the refrigerant introduction pipe 31 as in the cooler of the comparison example. Therefore, it is possible to attach the refrigerant introduction pipe 31 without inclination to the protruding pipe portion 22.

The refrigerant discharge pipe 32 can also be assembled to the in/out cooling tube 20 similarly to the refrigerant introduction pipe 31.

Sixth Embodiment

Figure 9:
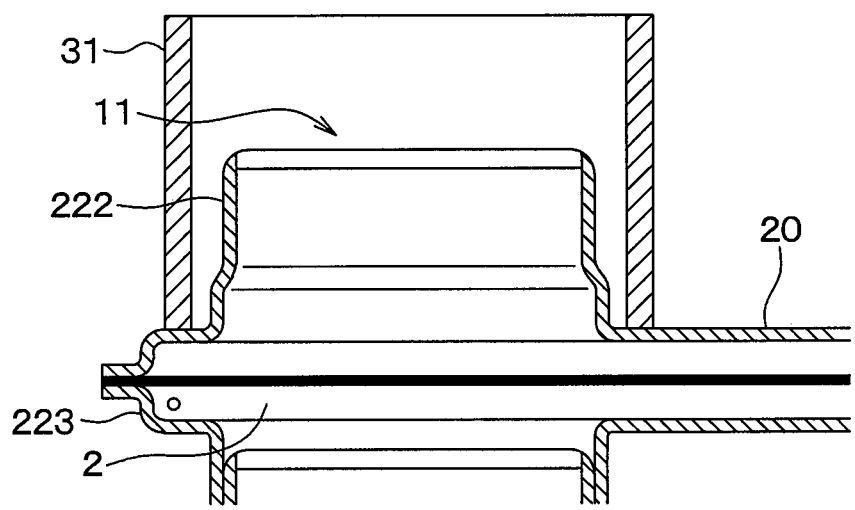
FIG. 9 is a partial enlarged view illustrating a multilayer cooler according to a sixth embodiment.

A multilayer cooler according to a sixth embodiment will be described with reference to FIG. 9. In this embodiment, the end surface of the refrigerant introduction pipe 31 intersects with the longitudinal direction of the refrigerant introduction pipe 31, and the end surface of the refrigerant introduction pipe 31 is directly joined to the in/out passage tube 20.

The end surface of the refrigerant introduction pipe 31 is perpendicular to the longitudinal direction of the refrigerant introduction pipe 31. The refrigerant introduction pipe 31 is arranged such that one end portion of the refrigerant introduction pipe 31 in the longitudinal direction is placed to cover the outer side of the small diameter pipe portion 222. The end surface of the refrigerant introduction pipe 31 is directly joined to the in/out passage tube 20.

According to such a configuration, the refrigerant introduction pipe 31 can be attached to the protruding pipe portion 22 irrespective of the length of the protruding pipe portion 22 and the shape of the side surface of the protruding pipe portion 22. In addition, since it is not necessary to process the pipe seat surface on the refrigerant introduction pipe 31, the cost can be reduced.

The refrigerant discharge pipe 32 can also be assembled to the in/out cooling tube 20 similarly to the refrigerant introduction pipe 31.

OTHER EMBODIMENTS (1) In each of the embodiments, the electronic component 4 is cooled by heat exchange between the electronic component 4 and the heat medium, but the heat exchange object is not limited to the electronic component 4.

(2) In each of the embodiments, the multilayer cooler cools a heat exchange object by heat exchange between the heat exchange object and the heat medium, but the heat exchange object may be heated by heat exchange between the heat exchange object and the heat medium as a multilayer heater. It should be appreciated that the present disclosure is not limited to the embodiments described above and can be modified appropriately within the scope of the appended claims. The embodiments above are not irrelevant to one another and can be combined appropriately unless a combination is obviously impossible.

In the respective embodiments above, it goes without saying that elements forming the embodiments are not necessarily essential unless specified as being essential or deemed as being apparently essential in principle. In a case where a reference is made to the components of the respective embodiments as to numerical values, such as the number, values, amounts, and ranges, the components are not limited to the numerical values unless specified as being essential or deemed as being apparently essential in principle. Also, in a case where a reference is made to the components of the respective embodiments above as to shapes and positional relations, the components are not limited to the shapes and the positional relations unless explicitly specified or limited to particular shapes and positional relations in principle.

What is claimed is:

1. A stacked heat exchanger comprising:
a plurality of passage tubes stacked with each other to support a heat exchange object from both sides, a passage being defined in the passage tube for a heat medium to exchange heat with the heat exchange object; and
a first pipe and a second pipe connected to one of the plurality of passage tubes located at one end in a stacking direction of the plurality of passage tubes, wherein
each of the plurality of passage tubes has a small diameter pipe portion and a large diameter pipe portion protruding from one side of the passage tube in the stacking direction and communicating with (i) an adjacent passage tube, or (ii) the first pipe and the second pipe, in the stacking direction,
each of the plurality of passage tubes, except for a passage tube at another end of the stacked heat exchanger, has the large diameter pipe portion and the small diameter pipe portion protruding from another side of the passage tube in the stacking direction and communicating with the adjacent passage tube,
the one of the plurality of passage tubes located at the one end in the stacking direction is an in/out passage tube, and
the first pipe has a surface at one end that is orthogonal to a longitudinal axis of the first pipe,
the second pipe has a surface at one end that is orthogonal to a longitudinal axis of the second pipe,
the surface at the one end of the first pipe and the surface at the one end of the second pipe are joined to the in/out passage tube,
the surface at the one end of the first pipe is disposed so as to surround an outer side of the small diameter pipe portion protruding from the one side of the in/out passage tube, and
the surface at the one end of the second pipe is disposed so as to surround an outer side of the large diameter pipe portion protruding from the one side of the in/out passage tube.

2. The stacked heat exchanger according to claim 1, wherein
the surface at the one end of the first pipe and the surface at the one end of the second pipe are pipe seat surfaces, the pipe seat surface being a flange having an L shaped cross section.

3. The stacked heat exchanger according to claim 2, further comprising:
a reinforcing plate that presses the pipe seat surface against the one side of the in/out passage tube.

4. The stacked heat exchanger according to claim 3, wherein
the reinforcing plate has a seat surface stepped portion partially protruding toward the pipe seat surface to be in contact with the pipe seat surface, and the seat surface stepped portion is formed to extend along a circumferential direction of the pipe seat surface.

5. The stacked heat exchanger according to claim 4, wherein
the reinforcing plate has a passage tube stepped portion partially protruding toward the one side of the in/out passage tube, and the passage tube stepped portion is formed on an outer periphery side of the seat surface stepped portion.

6. The stacked heat exchanger according to claim 1, wherein
an inner diameter of the first pipe and an inner diameter of the second pipe are less than or equal to an inner diameter of the small diameter pipe portion.

7. The stacked heat exchanger according to claim 1, further comprising a reinforcing plate provided on the one side of the in/out passage tube in which a refrigerant inlet and a refrigerant outlet are formed, the reinforcing plate covering the entire outer shell plate of the in/out passage tube between the first pipe and the second pipe, and further covering the surface at the one end of the first pipe and the surface at the one end of the second pipe.

8. The stacked heat exchanger according to claim 7, wherein the reinforcing plate is formed to cover a semicircular part of the small diameter pipe portion and a semicircular part of the large diameter pipe portion.

9. The stacked heat exchanger according to claim 1, wherein each of the plurality of passage tubes includes an intermediate plate supported between outer shell plates of the passage tube.

10. The stacked heat exchanger according to claim 1, wherein each of the plurality of passage tubes, except for a passage tube at the other end of the stacked heat exchanger, is arranged so that the small diameter pipe portion on the one side of the passage tube is disposed opposite the large diameter pipe portion on the other side of the passage tube, and the large diameter pipe portion on the one side of the passage tube is disposed opposite the small diameter pipe portion on the other side of the passage tube.

* * * * *